United States Patent
Arai

(10) Patent No.: US 11,758,726 B2
(45) Date of Patent: *Sep. 12, 2023

(54) SEMICONDUCTOR MEMORY DEVICE AND METHOD OF MANUFACTURING THE SAME

(71) Applicant: Kioxia Corporation, Tokyo (JP)

(72) Inventor: Shinya Arai, Yokkaichi (JP)

(73) Assignee: Kioxia Corporation, Tokyo (JP)

(*) Notice: Subject to any disclaimer, the term of this patent is extended or adjusted under 35 U.S.C. 154(b) by 203 days.

This patent is subject to a terminal disclaimer.

(21) Appl. No.: 17/206,763

(22) Filed: Mar. 19, 2021

(65) Prior Publication Data
US 2021/0210508 A1 Jul. 8, 2021

Related U.S. Application Data

(63) Continuation of application No. 16/566,036, filed on Sep. 10, 2019, now Pat. No. 10,991,719, which is a
(Continued)

(51) Int. Cl.
*H01L 21/28* (2006.01)
*H10B 43/27* (2023.01)
(Continued)

(52) U.S. Cl.
CPC ......... *H10B 43/27* (2023.02); *G11C 16/0466* (2013.01); *G11C 16/26* (2013.01);
(Continued)

(58) Field of Classification Search
None
See application file for complete search history.

(56) References Cited

U.S. PATENT DOCUMENTS

| 5,933,739 A | 8/1999 | Lin |
| 7,982,261 B2 | 7/2011 | Kidoh et al. |

(Continued)

FOREIGN PATENT DOCUMENTS

| JP | 2009-146954 | 7/2009 |
| JP | 2010-114204 | 5/2010 |

(Continued)

*Primary Examiner* — Su C Kim
(74) *Attorney, Agent, or Firm* — Oblon, McClelland, Maier & Neustadt, L.L.P.

(57) ABSTRACT

A semiconductor memory device according to an embodiment comprises: a semiconductor substrate; a stacked body having a plurality of first insulating layers and conductive layers stacked alternately on the semiconductor substrate; a columnar semiconductor layer contacting the semiconductor substrate in the stacked body being provided extending in a stacking direction of the stacked body and including a first portion and a second portion which is provided above the first portion; a memory layer provided on a side surface of the columnar semiconductor layer facing the stacked conductive layers and extending along the columnar semiconductor layer; and a second insulating layer provided between one of the first insulating layer and the conductive layers of the stacked body. The columnar semiconductor layer has a boundary of the first portion and the second portion, the boundary being close to the second insulating layer; and an average value of an outer diameter of the memory layer facing a side surface of the second insulating layer is larger than that of of the memory layer facing a side surface of a lowermost layer of the first insulating layers in the second portion.

20 Claims, 9 Drawing Sheets

Related U.S. Application Data continuation of application No. 15/824,396, filed on Nov. 28, 2017, now Pat. No. 10,461,092, which is a continuation of application No. 15/263,832, filed on Sep. 13, 2016, now Pat. No. 9,865,612.

(60) Provisional application No. 62/311,546, filed on Mar. 22, 2016.

(51) Int. Cl.
  *G11C 16/04* (2006.01)
  *H01L 49/02* (2006.01)
  *H10B 43/30* (2023.01)
  *G11C 16/26* (2006.01)
  *H10B 41/20* (2023.01)
  *H10B 41/23* (2023.01)

(52) U.S. Cl.
  CPC ........ *H01L 28/00* (2013.01); *H01L 29/40117* (2019.08); *H10B 43/30* (2023.02); *G11C 16/0483* (2013.01); *H10B 41/20* (2023.02); *H10B 41/23* (2023.02)

(56) References Cited

U.S. PATENT DOCUMENTS

| | | | |
|---|---|---|---|
| 8,030,700 | B2 | 10/2011 | Sakamoto |
| 8,338,882 | B2 | 12/2012 | Tanaka et al. |
| 9,356,042 | B2 | 5/2016 | Fukuzumi et al. |
| 9,768,192 | B1 | 9/2017 | Nakamura |
| 9,865,612 | B2 | 1/2018 | Arai |
| 2003/0100156 | A1 | 5/2003 | Mori |
| 2009/0230458 | A1 | 9/2009 | Ishiduki |
| 2009/0283819 | A1 | 11/2009 | Ishikawa |
| 2010/0059811 | A1 | 3/2010 | Sekine |
| 2010/0109065 | A1* | 5/2010 | Oh ................. H01L 27/0688 257/314 |
| 2010/0109072 | A1 | 5/2010 | Kidoh |
| 2012/0211821 | A1 | 8/2012 | Matsumoto |
| 2014/0295636 | A1 | 10/2014 | Makala |
| 2014/0367758 | A1 | 12/2014 | Izumida |
| 2015/0155296 | A1 | 6/2015 | Yoon |
| 2015/0380427 | A1* | 12/2015 | Sasaki ................. G11C 16/10 257/324 |
| 2017/0062454 | A1* | 3/2017 | Lu ................. H01L 21/76877 |

FOREIGN PATENT DOCUMENTS

| | | |
|---|---|---|
| JP | 2011-187794 | 9/2011 |
| JP | 2013-42179 | 2/2013 |

\* cited by examiner

SEMICONDUCTOR MEMORY DEVICE AND METHOD OF MANUFACTURING THE SAME

CROSS REFERENCE TO RELATED APPLICATION

This application is a Continuation of U.S. application Ser. No. 16/566,036 filed Sep. 10, 2019, which is a Continuation of U.S. application Ser. No. 15/824,396 filed Nov. 28, 2017, which is a Continuation of U.S. application Ser. No. 15/263,832 filed on Sep. 13, 2016, and is based upon and claims the benefit of priority from U.S. Provisional Patent Application No. 62/311,546, filed on Mar. 22, 2016, the entire contents of each of which are incorporated herein by reference.

FIELD

An embodiment described herein generally relates to a semiconductor memory device and a method of manufacturing the same.

BACKGROUND

A flash memory that stores data by accumulating a charge in a charge accumulation layer or floating gate, is known. Such a flash memory is connected by a variety of systems, such as NAND type or NOR type, and configures a semiconductor memory device. In recent years, increasing of capacity and raising of integration level of such a semiconductor memory device have been proceeding. Moreover, a semiconductor memory device in which memory cells are disposed three-dimensionally (a three-dimensional type semiconductor memory device) has been proposed to achieve increased capacity and raised integration level of the semiconductor memory device.

DETAILED DESCRIPTION

Figure 1:
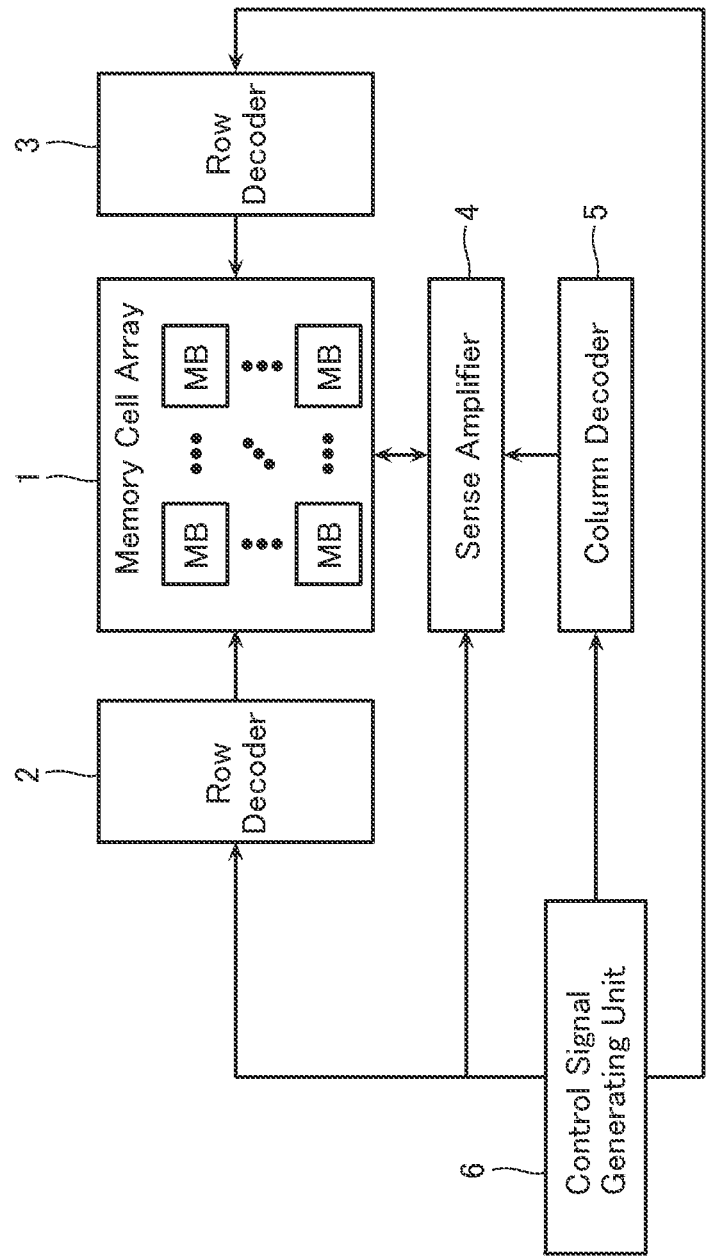
FIG. 1 is a functional block diagram showing a schematic configuration of a semiconductor memory device according to a first embodiment.

A semiconductor memory device according to an embodiment comprises: a semiconductor substrate; a stacked body having a plurality of first insulating layers and conductive layers stacked alternately on the semiconductor substrate; a columnar semiconductor layer contacting the semiconductor substrate in the stacked body being provided extending in a stacking direction of the stacked body and including a first portion and a second portion which is provided above the first portion; a memory layer provided on a side surface of the columnar semiconductor layer facing the stacked conductive layers and extending along the columnar semiconductor layer; and a second insulating layer provided between one of the first insulating layer and the conductive layers of the stacked body. The columnar semiconductor layer has a boundary of the first portion and the second portion, the boundary being close to the second insulating layer; and an average value of an outer diameter of the memory layer facing a side surface of the second insulating layer is larger than that of the memory layer facing a side surface of a lowermost layer of the first insulating layers in the second portion.

First Embodiment

Configuration

Next, a semiconductor memory device according to an embodiment will be described in detail with reference to the drawings. Note that this embodiment is merely an example. For example, each of the drawings of the semiconductor memory device employed in the embodiment below is schematic, and thicknesses, widths, ratios, and so on, of layers are not necessarily identical to those of the actual semiconductor memory device.

Moreover, the embodiment below relates to a semiconductor memory device having a structure in which a plurality of MONOS (Metal-Oxide-Nitride-Oxide-Semiconductor) type memory cells (transistors) are stacked along a direction intersecting a surface of a substrate (a Z direction in the drawings referred to hereafter), on the substrate, each of the MONOS type memory cells including: a semiconductor film acting as a channel provided in a column shape in the Z direction; and a gate electrode film provided, via a charge accumulation layer, on a side surface of the semiconductor film. However, the memory cell may be a memory cell of another form, for example, a SONGS (Semiconductor-Oxide-Nitride-Oxide-Semiconductor) type memory cell or MANOS (Metal-Aluminum Oxide-Nitride-Oxide-Semiconductor) type memory cell, or a floating gate type memory cell.

FIG. 1 is a functional block diagram showing a configuration of a semiconductor memory device according to a first embodiment. The semiconductor memory device according to the embodiment comprises: a memory cell array 1; row decoders 2 and 3; a sense amplifier 4; a column decoder 5; and a control signal generating unit 6. The memory cell array 1 includes a plurality of memory blocks MB. Each of the memory blocks MB includes a plurality of memory cells MC (not illustrated; mentioned later in FIG. 3) arranged three-dimensionally therein. The row decoders 2 and 3 decode a downloaded block address signal, and so on, and control a write operation and a read operation of data of the memory cell array 1. The sense amplifier 4 detects and amplifies an electrical signal flowing in the memory cell array 1 during the read operation. The column decoder 5 decodes a column address signal and controls the sense amplifier 4. The control signal generating unit 6, in addition to boosting a reference voltage and generating a voltage employed during write, erase or the read operations, generates a control signal and controls the row decoders 2 and 3, the sense amplifier 4, and the column decoder 5.

Figure 2:
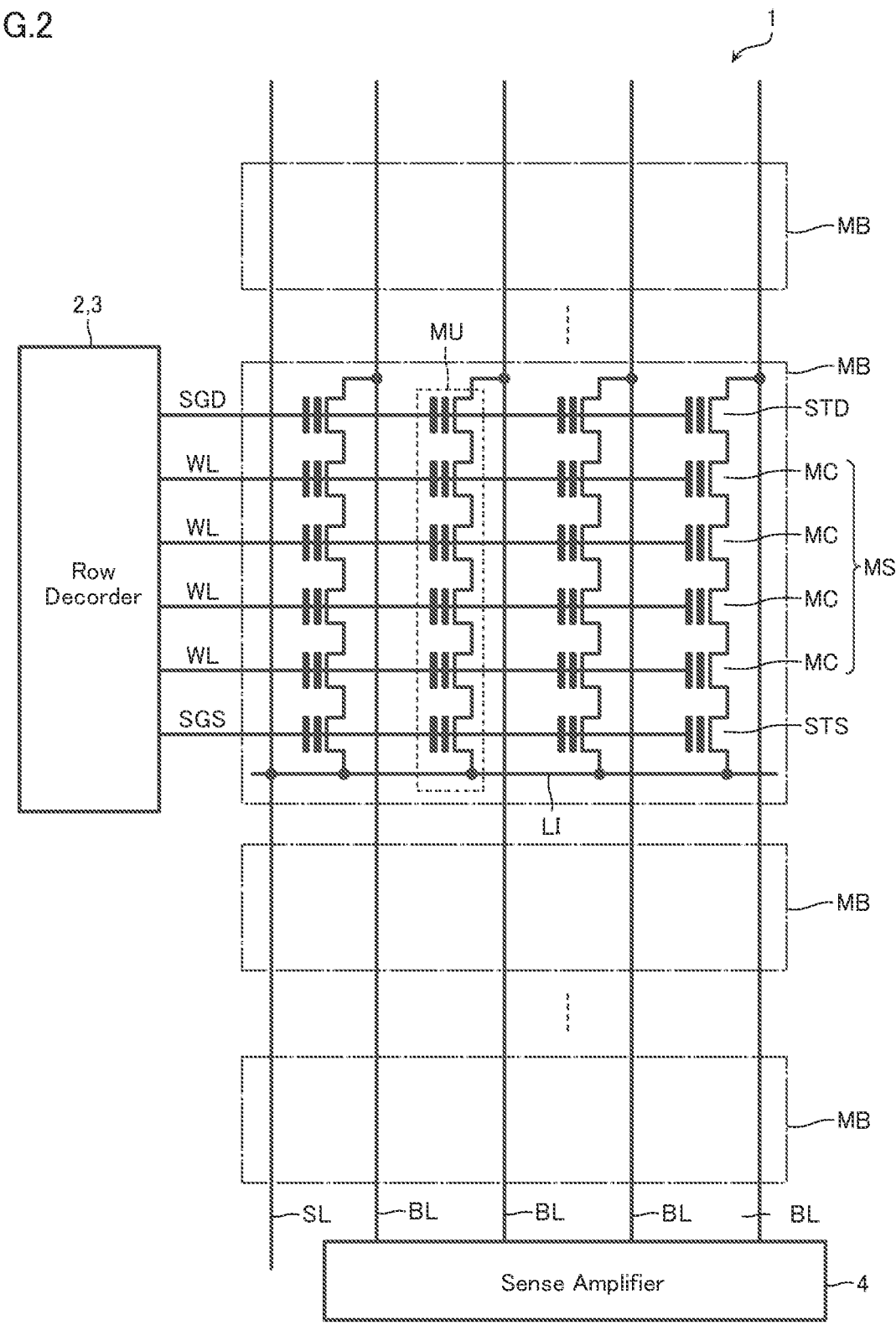
FIG. 2 is an equivalent circuit diagram showing a configuration of a memory cell array 1 of the same semiconductor memory device.

FIG. 2 is an equivalent circuit diagram showing a configuration of part of the memory cell array 1 according to the present embodiment.

The memory cell array 1 according to the present embodiment comprises the plurality of memory blocks MB. Moreover, a plurality of bitlines BL and a source line SL are commonly connected to these plurality of memory blocks MB. Each of the memory blocks MB is connected to the sense amplifier via the bit line BL and to an unillustrated source line driver via the source line SL.

The memory block MB comprises a plurality of memory units MU each having its one end connected to the bit line BL and having its other end connected, via a source contact LI, to the source line SL.

The memory unit MU comprises a plurality of the memory cells MC connected in series. As will be mentioned later, the memory cell MC comprises: a semiconductor layer; a charge accumulation layer; and a control gate. In addition, during various operations, a charge is accumulated in the charge accumulation layer (write operation), moreover, a charge is erased from the charge accumulation layer (erase operation), based on a voltage applied to the control gate, whereby a threshold value of the memory cell MC is changed. Data stored in the memory cell MC is determined (read operation) by detecting a magnitude of this threshold value. Note that hereafter, the plurality of memory cells MC connected in series will be called a "memory string MS".

Commonly connected to the control gates of pluralities of the memory cells MC configuring different memory strings MS are, respectively, word lines WL. These pluralities of memory cells MC are connected to the row decoder via the word lines WL.

The memory unit MU comprises a drain side select gate transistor STD connected between the memory string MS and the bit line BL. Connected to a control gate of the drain side select gate transistor STD is a drain side select gate line SGD. The drain side select gate line SGD is connected to the row decoder and selectively connects the memory string MS and the bit line BL based on an inputted signal.

The memory unit MU comprises a source side select gate transistor STS connected between the memory string MS and the source contact LI. Connected to a control gate of the source side select gate transistor STS is a source side select gate line SGS. The source side select gate line SGS is connected to the row decoder and selectively connects the memory string MS and the source line SL based on an inputted signal.

Figure 3:
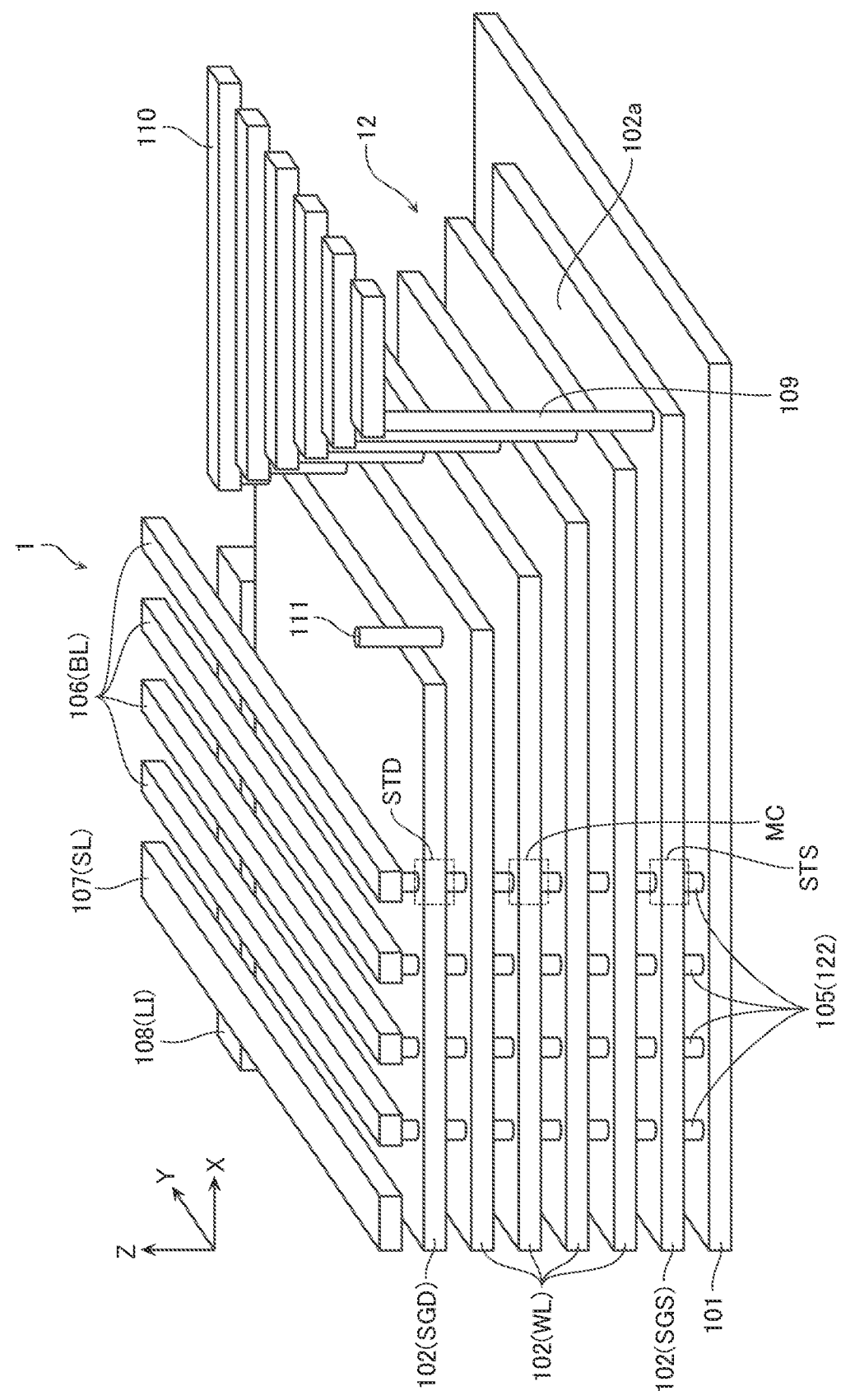
FIG. 3 is a perspective view showing a configuration of the memory cell array 1 of the same semiconductor memory device.

FIG. 3 is a schematic perspective view showing a configuration of part of the memory cell array 1. Note that in FIG. 3, in order to explain mainly a principal portion of the memory cell array 1, such as a conductive layer, part of the configuration, such as an insulating layer, is omitted.

The memory cell array 1 according to the present embodiment comprises: a substrate 101; and a plurality of conductive layers 102 stacked in the Z direction, via an unillustrated inter-layer insulating layer, on the substrate 101. In addition, the memory cell array 1 includes a plurality of memory columnar bodies 105 extending in the Z direction. An intersection of the conductive layer 102 and the memory columnar body 105 functions as the source side select gate transistor STS, the memory cell MC, or the drain side select gate transistor STD. The conductive layer 102 is configured from a conductive layer of the likes of tungsten (W) or polysilicon, for example, and functions as the word line WL, the source side select gate line SGS, and the drain side select gate line SGD.

A conductive layer 106 functioning as the bit line BL and a conductive layer 107 functioning as the source line SL are disposed above the conductive layer 102.

The memory cell array 1 comprises a conductive layer 108 that faces side surfaces in a Y direction of the plurality of conductive layers 102 and extends in an X direction. A lower surface of the conductive layer 108 contacts the substrate 101. The conductive layer 108 is configured from a conductive layer of the likes of tungsten (W), for example, and functions as the source contact LI.

The plurality of conductive layers 102 are formed in a stepped shape at their ends in the X direction and configure a stepped part 12.

A contact part 102a is formed at an extremity of each step configuring the stepped part 12. A contact 109 is disposed in the contact part 102a. The contact 109 is connected to an upper wiring line 110. Moreover, the stepped part 12 may comprise a support column 111 extending in the Z direction to penetrate a stepped structure 12. The support column 111 functions to maintain a posture of a stacked structure of the memory cell array 1 in a later-described step of replacing a sacrifice layer with a conductive layer. To simplify explanation, only one support column 111 is shown, but a plurality of support columns 111 may be provided.

Figure 4:
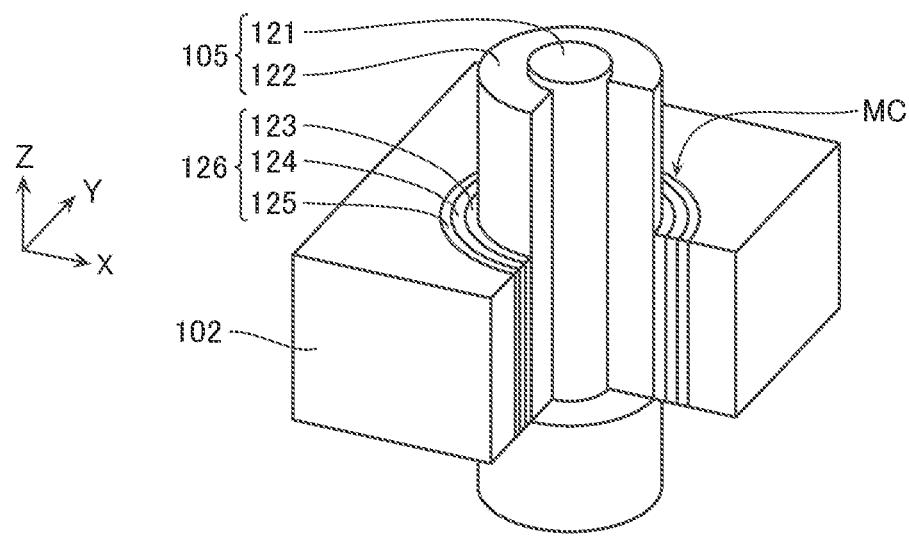
FIG. 4 is a schematic perspective cross-sectional view showing an example of configuration of one memory cell MC included in the same semiconductor memory device.

FIG. 4 is a schematic perspective view showing a configuration of the memory cell MC. Note that FIG. 4 shows the configuration of the memory cell MC, but the source side select gate transistor STS and the drain side select gate transistor STD may also be configured similarly to the memory cell MC. Moreover, in FIG. 4, in order to explain mainly a principal configuration of the memory cell MC, such as a conductive layer, a memory layer, or a semiconductor layer, part of the configuration, such as an insulating layer disposed above/below the conductive layer 102 or a barrier metal layer, is omitted.

The memory cell MC is provided so as to extend in the Z direction, at an intersection of the conductive layer 102 and the memory columnar body 105. The memory columnar body 105 comprises: a core insulating layer 121; and a semiconductor layer 122. The semiconductor layer 122 covers a sidewall of the core insulating layer 121. A memory film 126 is provided on a side surface of the semiconductor layer 122. The memory film 126 includes: a tunnel insulating layer 123 provided on the side surface of the semiconductor layer 122; a charge accumulation layer 124 provided on a side surface of the tunnel insulating layer 123; and a block insulating layer 125 provided on a side surface of the charge accumulation layer 124. Moreover, the conductive layer 102 is provided in a periphery of the block insulating layer 125.

The core insulating layer 121 is configured from an insulating layer of the likes of silicon oxide, for example. The semiconductor layer 122 is configured from a semiconductor layer of the likes of polysilicon, for example. Moreover, the semiconductor layer 122 functions as a channel body of the memory cell MC, the source side select gate transistor STS, and the drain side select gate transistor STD. The tunnel insulating layer 123 is configured from an insulating layer of the likes of silicon oxide, for example. The charge accumulation layer 124 is configured from an insulating layer capable of accumulating a charge, of the likes of silicon nitride, for example. The block insulating layer 125 is configured from, for example, silicon oxide or from a metal oxide such as hafnium oxide, aluminum oxide, zirconium oxide, titanium oxide, or tantalum oxide whose permittivity is higher than that of silicon oxide, or from a stacked body of these.

Next, a configuration of the semiconductor memory device according to the present embodiment will be described in more detail with reference to FIGS. 5 to 7.

Figure 5:
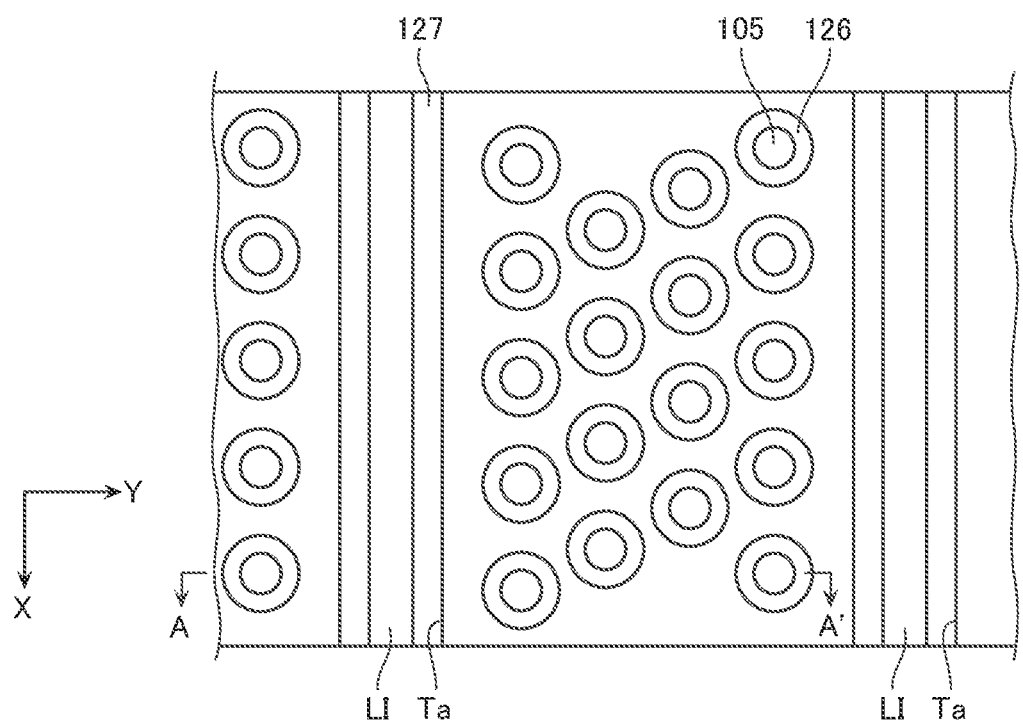
FIG. 5 is a plan view showing a configuration of part of the memory cell array 1 included in the same semiconductor memory device.

As shown in FIG. 5, in the present embodiment, the memory columnar bodies 105 are arranged staggered. In addition, the source contact LI is formed in a striped shape having the X direction as its longitudinal direction. This source contact LI is implanted, via an inter-layer insulating film 127, in a trench Ta that divides the memory cell array 1 in a block unit.

Figure 6:
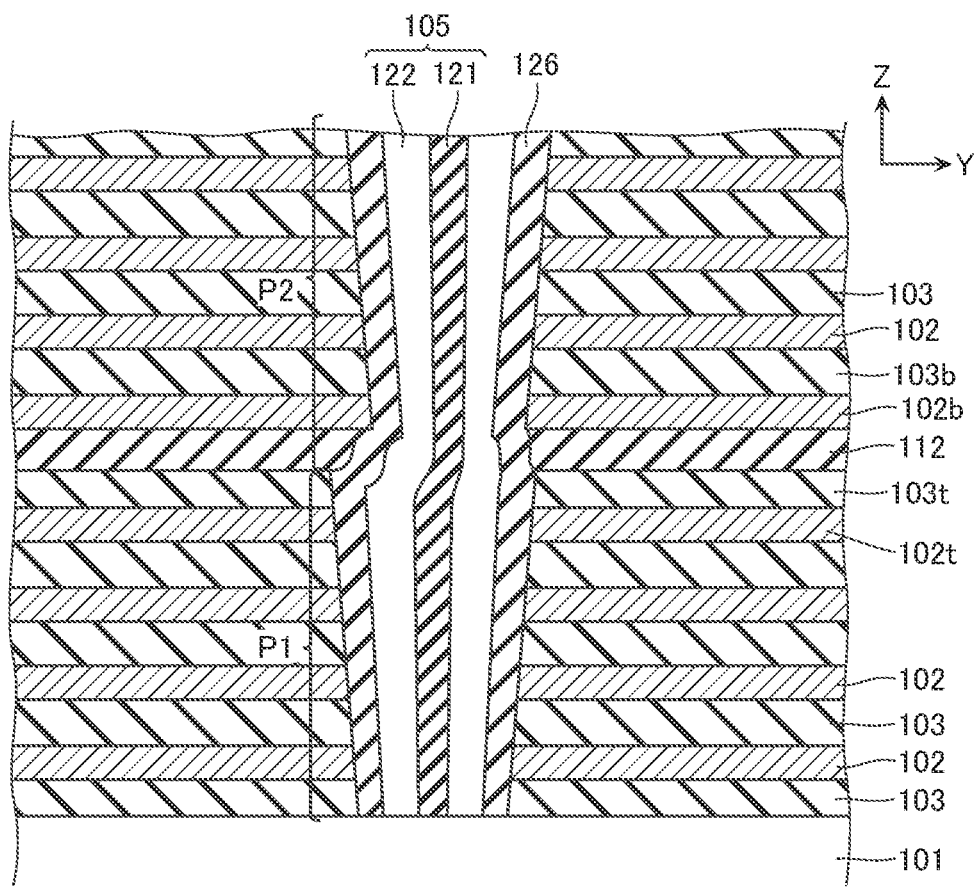
FIGS. 6 and 7 are schematic cross-sectional view showing configurations of the same semiconductor memory device.

As shown in FIG. 6, in the present embodiment, the above-described memory columnar body 105 is provided on the semiconductor substrate 101. The memory film 126 is provided on a side surface of the memory columnar body 105.

The memory columnar body 105 and the memory film 126 include a first portion P1 and a second portion P2. A lower end of the first portion P1 is connected to the semiconductor substrate 101. A lower end of the second portion P2 is connected to an upper end of the first portion P1.

Figure 7:
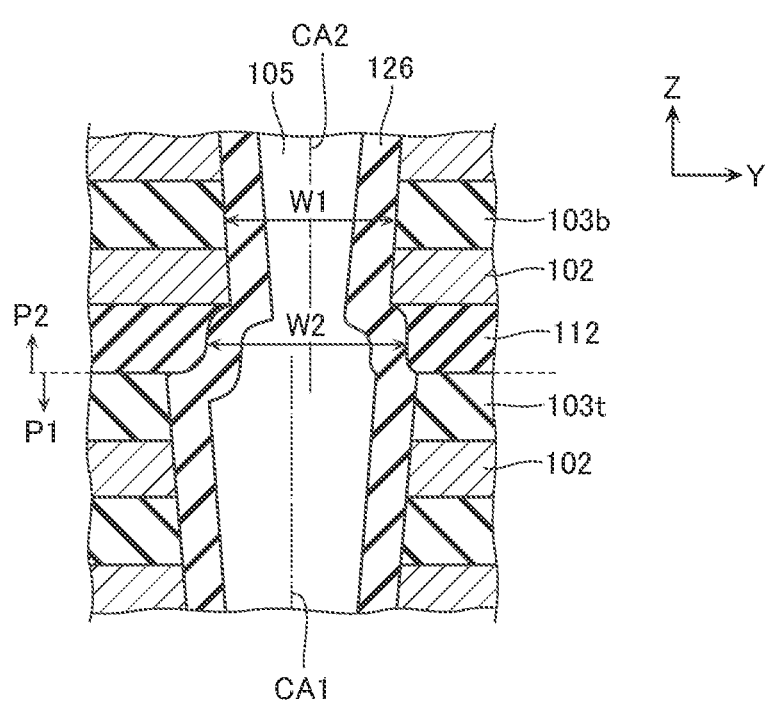

Moreover, as shown in FIG. 7, a central axis CA1 of the first portion P1 and a central axis CA2 of the second portion P2 are in different positions in the Y direction. In other words, the two central axes CA1 and CA2 never form an identical straight line in the Y-Z plane shown in FIG. 7. Now, the central axis CA1 of the first portion P1 or central axis CA2 of the second portion P2 represents a line passing through the center in an X-Y cross section, in the first portion P1 or second portion P2, of the memory columnar body 105 and the memory film 126. Note that the "center" of the above-described central axis refers to the center of the memory columnar body 105 or the memory film 126 in the case where a certain degree of processing variation or distortion of shape are ignored and where the first portion P1 and second portion P2 are regarded as being on the whole column shaped, and are regarded as being substantially circular shaped in an X-Y cross-section. Moreover, the "axis" is a line passing through the above-described "center", and is not necessarily limited to extending in the Z direction (being perpendicular to the surface of the substrate 101).

In FIG. 7, the two central axes CA1 and CA2 are misaligned in the Y direction, but they may further be misaligned also in the X direction. Moreover, they may be misaligned in either one of the X direction or the Y direction.

A plurality of the conductive layers 102 are stacked in the Z direction, via an inter-layer insulating layer 103, in a periphery of the memory film 126.

In the present embodiment, an insulating layer 112 is provided between an uppermost layer of the inter-layer insulating layer 103$t$ provided on a side surface of the first portion P1 and a lowermost layer of the conductive layer 102$b$ provided on a side surface of the second portion P2, at a boundary of the first portion P1 and the second portion P2 of the memory columnar body 105 and the memory film 126. In other words, the boundary of the first portion P1 and the second portion P2 of the memory columnar body 105 and the memory film 126 is close to the insulating layer 112.

Moreover, an average value W2 of an outer diameter of the memory film 126 of a portion where the insulating layer 112 is provided is larger than an average value W1 of an outer diameter of the memory film 126 of a portion facing a lowermost layer of the inter-layer insulating layer 103$b$ of the second portion P2. Furthermore, outer diameters of the memory layer 126 and the memory columnar body 105 facing the insulating layer 112 increase in a downward Z direction. Now, the average value W1 or W2 of the outer diameter refers to an average value of the outer diameter in an X-Y cross section, of the memory film 126 of a portion facing the inter-layer insulating layer 103$b$ or the memory film 126 of a portion where the insulating layer 112 is provided. Moreover, the memory film 126 has the configuration shown in FIG. 4. Therefore, the outer diameter of the memory film 126 means an outer diameter of the block insulating layer 125 in the present embodiment.

Figure 15:
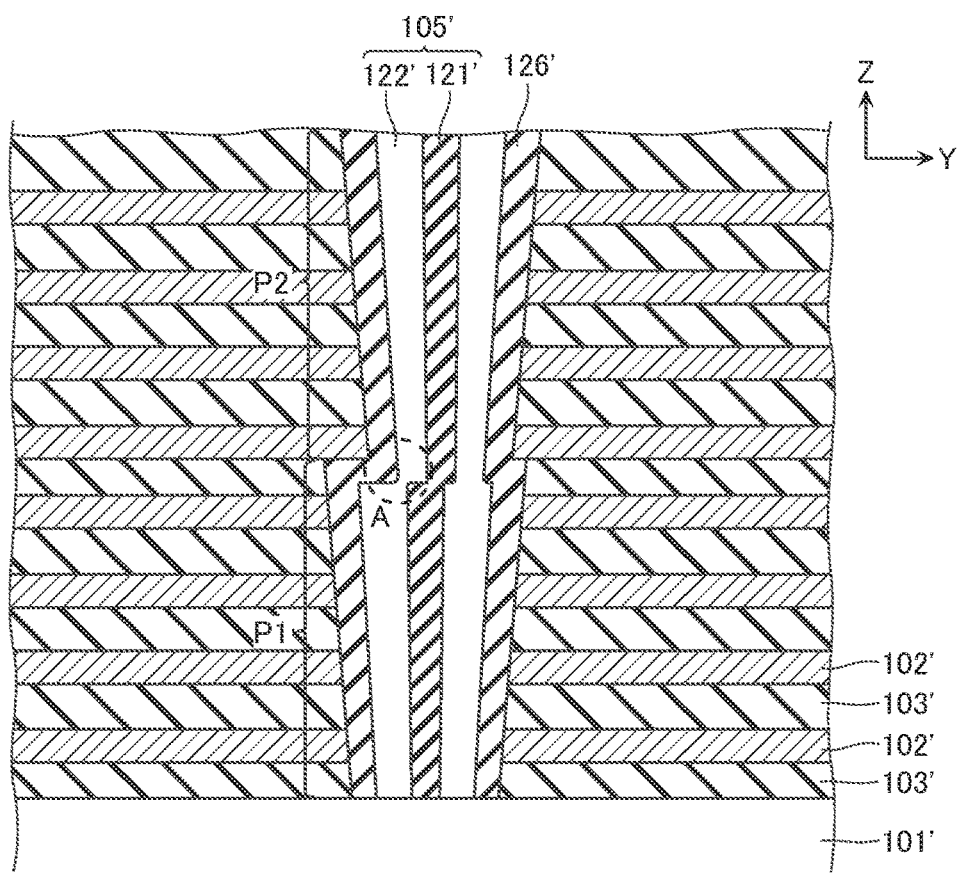
FIG. 15 is a schematic cross-sectional view showing a comparative example.

Now, the case where the insulating layer 112 is not provided will be described using a comparative example of FIG. 15. In this comparative example, a portion (portion surrounded by the dotted line A) close to the boundary of the first portion P1 and the second portion P2 does not have the insulating layer 112 disposed therein, hence outer diameters of a memory film 126' and a semiconductor layer 122' of a memory columnar body 105' decrease sharply in a downward Z direction, and the semiconductor layer 122' of the portion close to the boundary is thinned more than another portion. In other words, the semiconductor layer 122' forms a current channel of each of the memory cells, but in the portion close to the boundary, a width of the semiconductor layer 122' is reduced, whereby resistance of the current channel ends up rising.

On the other hand, in the present embodiment, the insulating layer 112 is provided close to the boundary of the first portion P1 and the second portion P2, hence a distance between the uppermost layer of the conductive layer 102$t$ (uppermost layer of the memory cell MC) facing the first portion P1 and the lowermost layer of the conductive layer 102$b$ (lowermost layer of the memory cell MC) facing the second portion P2 ends up being separated. Furthermore, the outer diameters of the memory film 126 and the semiconductor layer 122 of the memory columnar body 105 facing the insulating layer 112 increase gently in a downward Z direction. In other words, there is a structure in which although the width of the semiconductor layer 122 narrows toward the portion close to the boundary, narrowing of the width is relieved in proportion to a film thickness of the insulating layer 112, and from there on there is a broadening of the width to a certain depth.

As a result, a rise in resistance of the semiconductor layer 122 acting as a current channel, accompanying the decrease in diameter in an X-Y cross section of the semiconductor layer 122 at the boundary of the first portion P1 and the second portion P2, of the memory columnar body 105, is suppressed. In other words, it becomes possible to prevent deterioration of current characteristics and to maintain good cell characteristics.

Moreover, in the present embodiment, an inner side surface of the insulating layer 112 has a gentle curved shape. As a result, even when the central axis of the first portion P1 and the central axis of the second portion P2 are misaligned, misalignment of the central axes can be smoothly connected, hence a film thickness of the memory film 126 provided on the inner side surface of the insulating layer 112 can be kept uniform. Therefore, it also becomes possible to suppress deterioration of withstand voltage of the memory film 126 due to the film thickness of the memory film 126 varying, and to improve reliability of the memory cell.

Note that the inter-layer insulating layer 103 is configured from an insulating material of the likes of silicon oxide, for example. The insulating layer 112 is configured from an insulating material of the likes of silicon oxide, for example Now, as a condition for selecting a material of the insulating layer 112, the insulating layer 112 is preferably of a material whose etching rate with respect to etching performed in a later-described method of manufacturing is higher than that of the inter-layer insulating layer 103. These materials, etching conditions, and so on, will be described later.

Method of Manufacturing

The method of manufacturing according to the present embodiment will be described using FIGS. 8 to 13.

Figure 8:
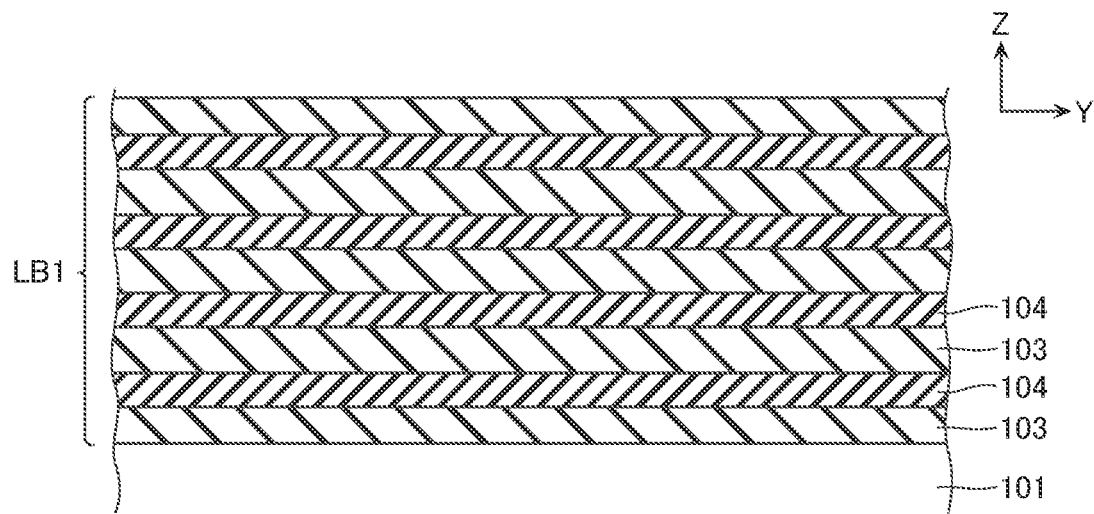
FIGS. 8 to 13 are schematic cross-sectional views showing a method of manufacturing the same semiconductor memory device.

As shown in FIG. 8, a plurality of the inter-layer insulating layers 103 and sacrifice layers 104 are stacked alternately on the semiconductor substrate 101. In this way, a first stacked body LB1 corresponding to the first portion P1 is formed. The sacrifice layer 104 is configured from silicon nitride, for example. Moreover, in the present embodiment, the inter-layer insulating layer 103 is configured from silicon oxide using a CVD method.

Figure 9:
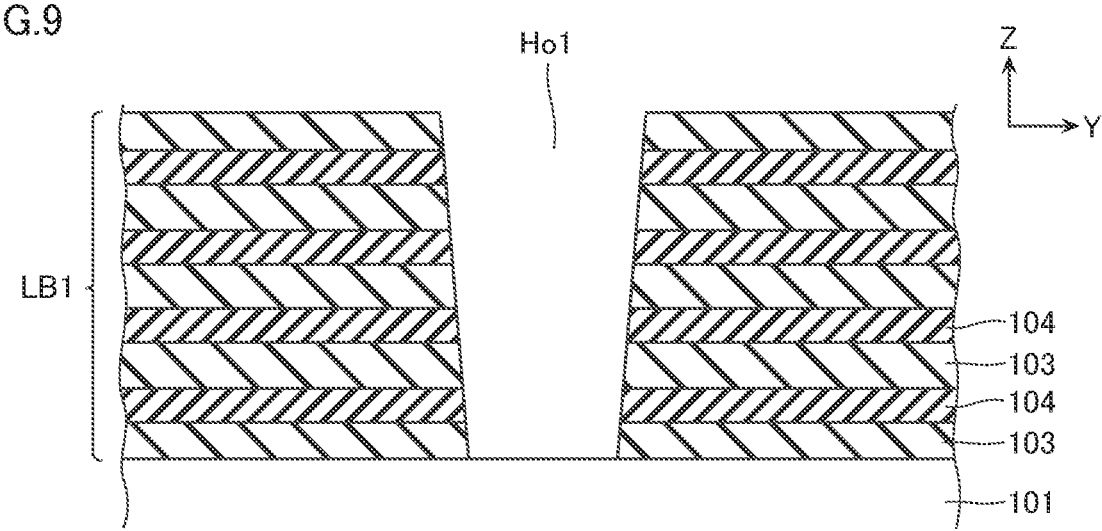

As shown in FIG. 9, patterning of a desired pattern corresponding to a memory hole MH is performed by lithography, and a first hole Ho1 is formed by RIE or wet etching.

Figure 10:
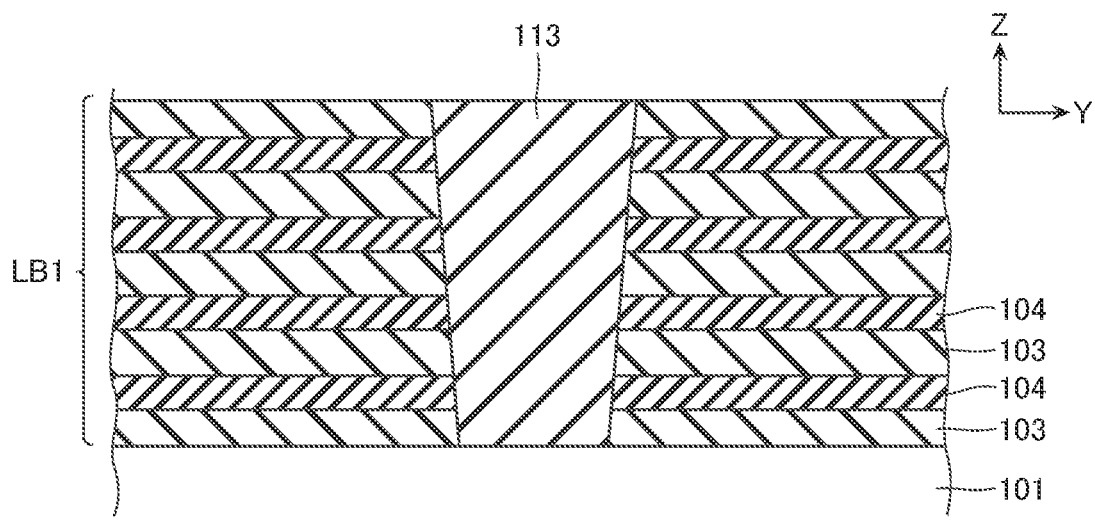

As shown in FIG. 10, a sacrifice layer 113 is formed by using a deposition method such as CVD in the first hole Ho1. Note that other layers and films described below could be formed similarly. In the present embodiment, the sacrifice layer 113 is configured from silicon. Alternatively, it is also possible to employ a stacked body configured from titanium nitride and tungsten sequentially formed from an inner sidewall of the hole Ho1.

Figure 11:
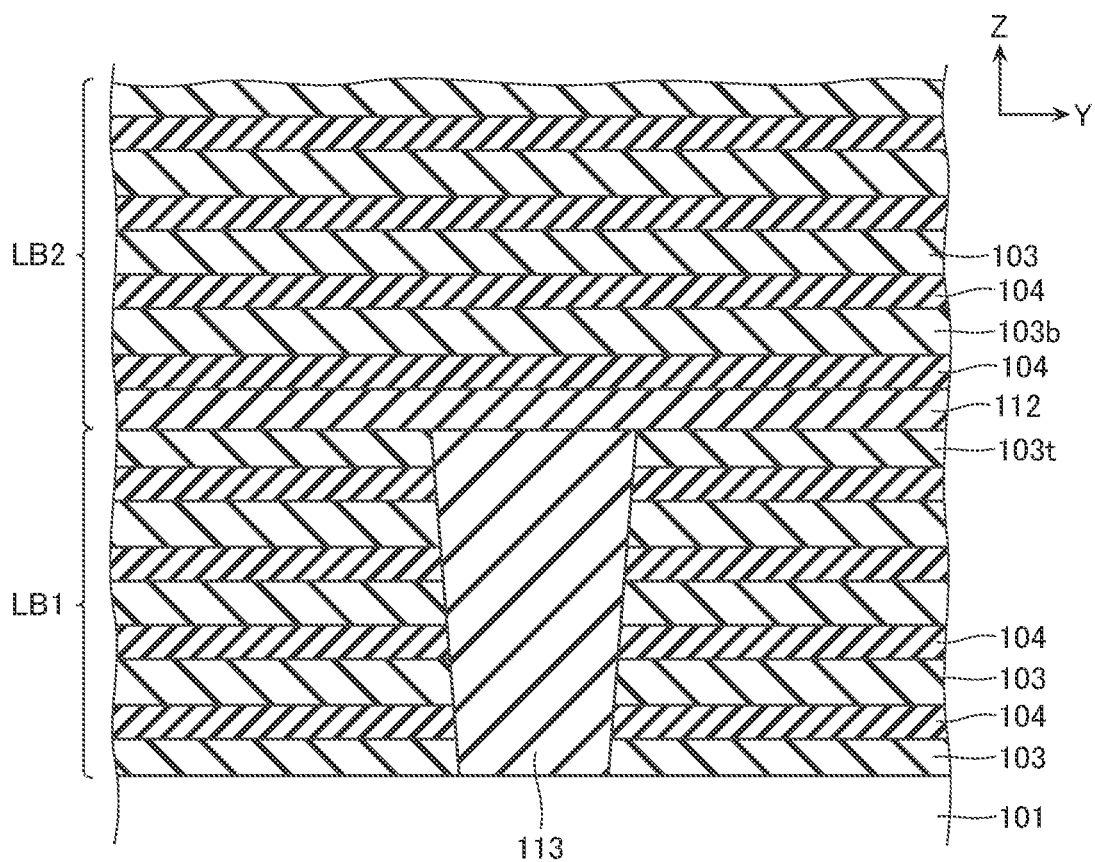

As shown in FIG. 11, the insulating layer 112 is formed on the first stacked body LB1, and a plurality of the inter-layer insulating layers 103 and sacrifice layers 104 are stacked alternately on the insulating layer 112. In this way, a second stacked body LB2 corresponding to the second portion P2 is formed.

Now, as mentioned above, the insulating layer 112 is configured from a material whose etching rate in a certain etching method is higher than that of the inter-layer insulating layer 103. Specifically, the insulating layer 112 is configured from a material having a higher etching rate than the inter-layer insulating layer 103 during etching employed during removal of the sacrifice layer 113, which will be described below. In the present embodiment, the inter-layer insulating layer 103 is configured from silicon oxide using a plasma CVD method. In this case, during removal of the sacrifice layer 113, wet etching employing a dilute hydrofluoric acid (dHF) solution, for example, is performed. Moreover, the insulating layer 112 is configured from a material whose etching rate with respect to the dilute hydrofluoric acid solution is higher than that of the silicon oxide configuring the inter-layer insulating layer 103. Specifically, the insulating layer 112 is configured from silicon oxide formed using a plasma CVD method, in the same way as the inter-layer insulating layer 103, for example. However, formation conditions of the inter-layer insulating layer 103 and the insulating layer 112 are made different. Specifically, for example, a formation condition of the inter-layer insulating layer 103 is set to being performed under an atmosphere of about 300° C., and a formation condition of the insulating layer 112 is set to being performed under an atmosphere of about 200° C. which is more low-temperature than the formation condition of the inter-layer insulating layer 103. As a result, a large amount of impurities is mixed into the insulating layer 112, and Si—OH bonds or Si—H bonds increase, whereby the number of Si—O bonds decreases. In other words, the insulating layer 112 attains a state where oxygen is more deficient than in a stoichiometry state, and its density decreases. As a result, the insulating layer 112 becomes more easily etched than the inter-layer insulating layer 103.

Now, a film thickness of the inter-layer insulating layer 103 is set to about 35 nm, for example. In this case, a combined film thickness of the insulating layer 112 and the uppermost layer of the inter-layer insulating layer 103t of the first stacked body LB1 is preferably about 70 nm or less from a viewpoint of suppressing channel resistance.

However, the combined film thickness of the insulating layer 112 and the inter-layer insulating layer 103t may be set to about the same as a film thickness of another inter-layer insulating layer 103. This makes it possible to suppress an increase in oxide film thickness close to the boundary of the first portion P1 and the second portion P2. Therefore, increase in channel resistance is suppressed.

A film thickness of the insulating layer 112 may be about the same as the film thickness of another inter-layer insulating layer 103. Therefore, for example, the film thickness of the inter-layer insulating layer 103t and the film thickness of the insulating layer 112 may each be set to about 35 nm. The film thickness of the insulating layer 112 is of course not limited to this, and may be 20 to 50 nm, for example.

However, the film thickness of the insulating layer 112 may be made greater than that of the inter-layer insulating layer 103t. As a result, a level difference close to the boundary of the first portion P1 and the second portion P2 during later memory hole MH formation can be made gentle, and formation of the memory film 126 can be performed favorably.

Figure 12:
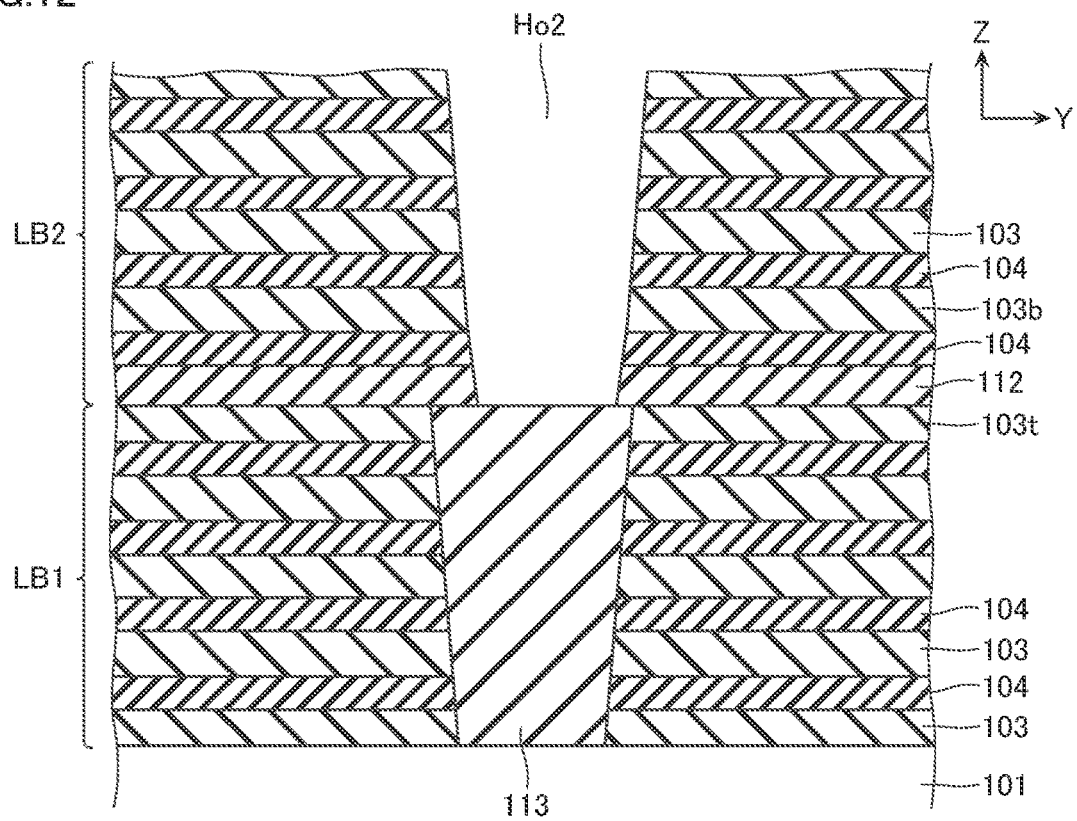

As shown in FIG. 12, patterning of a desired pattern corresponding to the memory hole MH is performed by lithography, and a second hole Ho2 is formed by RIE or wet etching, similarly to in FIG. 9.

Figure 13:
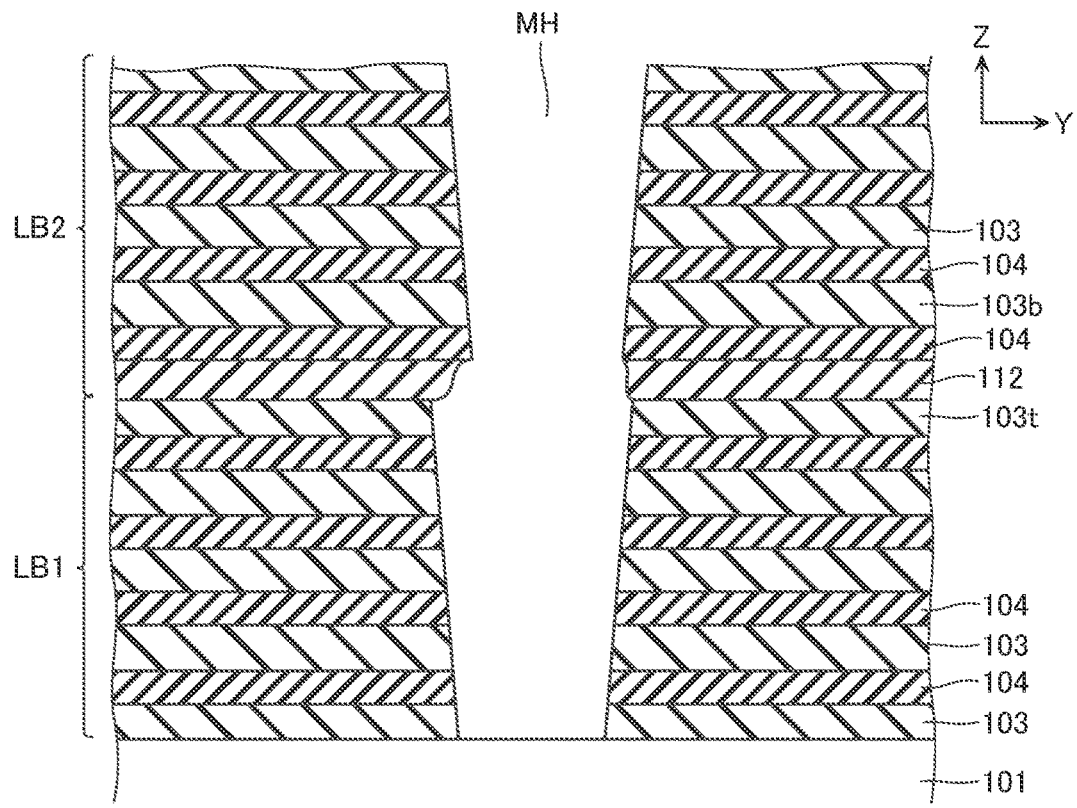

As shown in FIG. 13, the sacrifice layer 113 is selectively removed by wet etching using a dilute hydrofluoric acid solution. At this time, as mentioned above, a film quality of the insulating layer 112 is less dense than that of the inter-layer insulating layer 103, hence etching of the insulating layer 112 proceeds relatively more quickly than etching of the inter-layer insulating layer 103, and an inner diameter of the inner sidewall of the insulating layer 112 increases in a downward Z direction. In this way, the memory hole MH is formed.

Then, the memory film 126 and the memory columnar body 105 are formed sequentially on an inner wall of the memory hole MH, whereby the configuration of FIG. 6 is obtained.

Now, in the step of forming the memory film 126 and the memory columnar body 105 on the inner wall of the memory hole MH, it is required that, after formation of the memory film 126, in order to connect the substrate 101 or a layer epitaxially grown thereon to the later-formed semiconductor layer 122, part of the memory film 126 in a memory hole MH bottom part is removed by etching, and a substrate 101 surface is exposed.

However, there is a risk that if the memory hole MH is formed divided into a lower layer memory hole (first hole Ho1) and an upper layer memory hole (second hole Ho2), then when a position of the second hole Ho2 is misaligned in the XY directions with respect to a central axis direction of the first hole Ho1, an opening of the portion close to the boundary becomes small, and sufficient RIE cannot be performed.

On the other hand, by forming the insulating layer 112 from a material more easily etched than that of the inter-layer insulating layer 103 as in the present embodiment, the opening of the portion close to the boundary of the first hole Ho1 and the second hole Ho2 can be made larger, and RIE can be performed favorably to the memory hole MH bottom part. Moreover, since there is no need for the memory film 126 to be film thinned to broaden the opening, memory characteristics are never degraded by film thinning.

Modified Example

Figure 14:
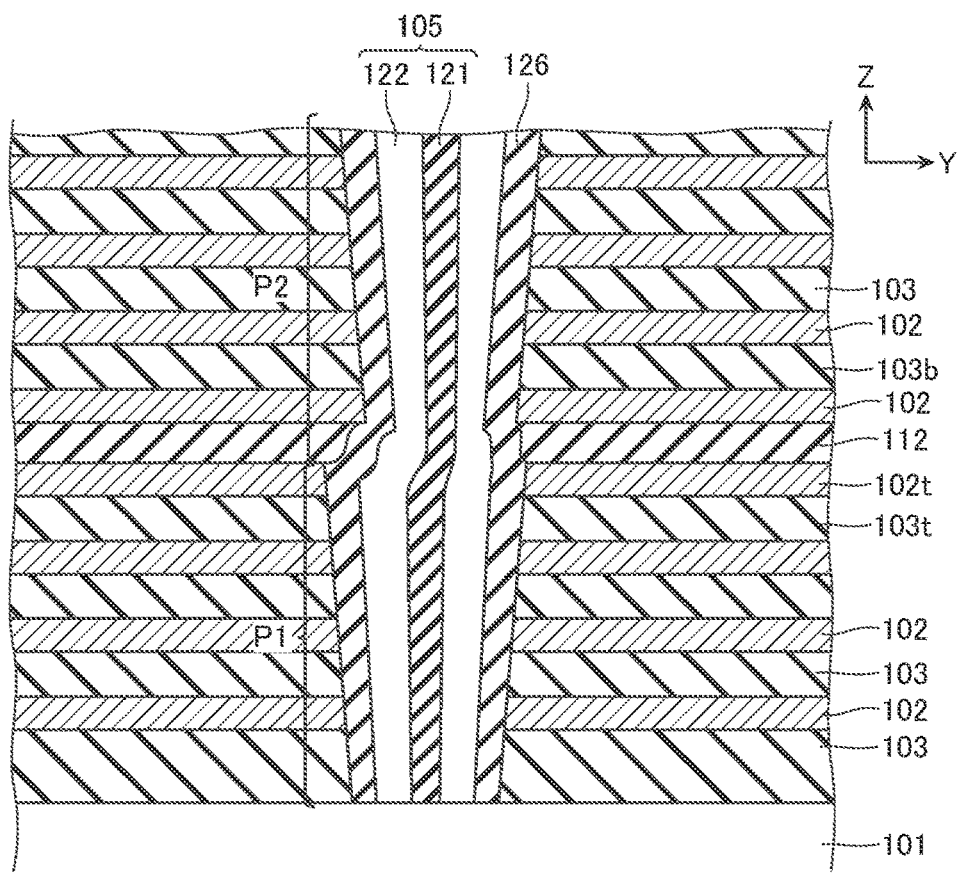
FIG. 14 is a schematic cross-sectional view showing a configuration of a semiconductor memory device according to a modified example.

As shown in FIG. 14, there may be a configuration in which the conductive layer 102t, not the inter-layer insulating layer 103t, is adopted as a layer below the insulating layer 112. By doing so, a film thickness of silicon oxide between the first portion P1 and the second portion P2 of the memory film 126 and the memory columnar body 105 is thinned, and a voltage applied to the conductive layer 102 (word line WL) to invert the semiconductor layer 122 can be reduced.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a stacked body including:
a first stacked unit and a second stacked unit stacked above the first stacked unit, each of the first and second stacked units including a plurality of electrode layers alternately stacked with a plurality of first insulating layers therebetween, and
an intermediate insulating layer provided above the first stacked unit and below the second stacked unit; and
a columnar member piercing the stacked body in a stacking direction of the stacked body, the columnar member including an intermediate columnar part inside the intermediate insulating layer, wherein
a diameter of the intermediate columnar part in a first direction perpendicular to the stacking direction is broadened downwardly in an upper portion of the intermediate insulating layer as compared with a diameter of the columnar member in the first direction in a portion piercing a lowermost electrode layer of the electrode layers in the second stacked unit, a sidewall of the intermediate columnar part in the upper portion of the intermediate insulating layer having a curved shape in a cross section along the stacking direction, the diameter of the intermediate columnar part in the upper portion of the intermediate insulating layer being broadened downwardly on both sides in the first direction, and
a columnar portion included in the intermediate columnar part where the diameter of the intermediate columnar part being broadened downwardly on both sides in the first direction is formed continuously in the stacking direction.

2. The device according to claim 1, wherein
the columnar portion of the intermediate columnar part of which the diameter is broadened downwardly does not reach any electrode layers functioning as word lines in the first stacked unit, memory cells being provided at intersections of the word lines and the columnar member.

3. The device according to claim 1, wherein
the intermediate columnar part includes a core insulator and a semiconductor layer covering a sidewall of the core insulator.

4. The device according to claim 3, wherein
the core insulator includes silicon oxide and the semiconductor layer includes silicon.

5. The device according to claim 1, wherein
memory cells are provided at intersections of the electrode layers and the columnar member, and each of the memory cells includes a layer capable of accumulating a charge provided around an outer surface of the columnar member.

6. The device according to claim 5, wherein
each of the memory cells further includes a tunnel insulating layer provided between the columnar member and the layer capable of accumulating a charge.

7. The device according to claim 6, wherein
the tunnel insulating layer extends in the stacking direction on the outer surface of the columnar member.

8. The device according to claim 1, wherein
the columnar member comprises a semiconductor portion extending in the stacking direction and functioning as a channel body of memory cells, the memory cells being provided at intersections of the electrode layers and the columnar member.

9. The device according to claim 8, wherein
the columnar member further comprises a core insulator, the semiconductor portion covering a sidewall of the core insulator.

10. The device according to claim 8, wherein
a lower end of the semiconductor portion is electrically connected to a source line provided below the first stacked unit and an upper end of the semiconductor portion is electrically connected to a bit line provided above the second stacked unit.

11. The device according to claim 1, wherein
a thickness of the intermediate insulating layer is thicker than respective thicknesses of the first insulating layers in the stacking direction.

12. The device according to claim 1, wherein
the electrode layers include silicon and the first insulating layers include silicon oxide.

13. The device according to claim 1, wherein
the diameter of the columnar member in the first direction is narrowed downwardly in a lower portion of the second stacked unit.

14. The device according to claim 1, wherein
the diameter of the columnar member in the portion piercing the lowermost electrode layer is narrowed downwardly.

15. A semiconductor memory device, comprising:
first memory cells provided in a first stacked body including a plurality of first electrode layers alternately stacked with a plurality of first insulating layers therebetween, the first memory cells including the first electrode layers as control gates and a first semiconductor portion as channels extending inside the first stacked body;

second memory cells provided in a second stacked body including a plurality of second electrode layers alternately stacked with a plurality of second insulating layers therebetween, the second stacked body being stacked above the first stacked body, the second memory cells including the second electrode layers as control gates and a second semiconductor portion as channels extending inside the second stacked body and being electrically connected to the first semiconductor portion; and an intermediate insulating layer provided above the first stacked body and below the second stacked body, wherein the first and second semiconductor portions are included in a columnar member provided in a hole piercing the first and second stacked bodies and the intermediate insulating layer in a stacking direction of the first and second stacked bodies;

a diameter of the hole in a first portion piercing an upper portion of the intermediate insulating layer is broadened downwardly as compared with the diameter of the hole in a second portion piercing a lowermost second electrode layer of the second electrode layers, an inner sidewall of the intermediate insulating layer in the upper portion having a curved shape in a cross section along the stacking direction, the diameter of the hole in the first portion being broadened downwardly on both sides in a first direction perpendicular to the stacking direction, and a semiconductor included in the columnar member and disposed in the hole in the first portion is formed in one body within a stacking direction position where the diameter of the hole is broadened downwardly on both sides in the first direction.

16. The device according to claim 15, wherein the first portion of the hole of which the diameter is broadened downwardly does not reach an uppermost first electrode layer of the first electrode layers.

17. The device according to claim 16, wherein no conductive layer is provided between the uppermost first electrode of the first electrode layers and the lowermost second electrode layer of the second electrode layers.

18. The device according to claim 15, wherein the first semiconductor portion covers a sidewall of a first core insulator part and the second semiconductor portion covers a sidewall of a second core insulator part, the first and second core insulator parts being included in the columnar member.

19. The device according to claim 18, wherein the first and second core insulators include silicon oxide and the first and second semiconductor portions include silicon.

20. The device according to claim 15, wherein a lower end of the first semiconductor portion is electrically connected to a source line provided below the first stacked body and an upper end of the second semiconductor portion is electrically connected to a bit line provided above the second stacked body.

* * * * *